United States Patent
Terada et al.

(10) Patent No.: US 8,811,078 B2
(45) Date of Patent: Aug. 19, 2014

(54) SEMICONDUCTOR MEMORY DEVICE

(75) Inventors: Yutaka Terada, Osaka (JP); Masakazu Kurata, Osaka (JP)

(73) Assignee: Panasonic Corporation, Osaka (JP)

( * ) Notice: Subject to any disclaimer, the term of this patent is extended or adjusted under 35 U.S.C. 154(b) by 148 days.

(21) Appl. No.: 13/493,671

(22) Filed: Jun. 11, 2012

(65) Prior Publication Data

US 2012/0243315 A1 Sep. 27, 2012

Related U.S. Application Data

(63) Continuation of application No. PCT/JP2010/007285, filed on Dec. 15, 2010.

(30) Foreign Application Priority Data

Jan. 29, 2010 (JP) ................................. 2010-017779

(51) Int. Cl.
*G11C 16/10* (2006.01)
*H01L 27/112* (2006.01)
*H01L 27/115* (2006.01)
*G11C 16/04* (2006.01)
*G11C 16/06* (2006.01)

(52) U.S. Cl.
CPC ........ *H01L 27/112* (2013.01); *H01L 27/11519* (2013.01); *G11C 16/0408* (2013.01); *H01L 27/115* (2013.01); *G11C 16/06* (2013.01)
USPC ............ 365/185.05; 365/185.33; 365/185.17; 365/185.18; 365/185.29

(58) Field of Classification Search
USPC ..................... 365/185.05, 63, 185.33, 185.11, 365/185.29, 185.17, 185.18, 185.27
See application file for complete search history.

(56) References Cited

U.S. PATENT DOCUMENTS

| 4,982,364 | A | 1/1991 | Iwahashi | |
|---|---|---|---|---|
| 5,877,977 | A | 3/1999 | Essaian | |
| 6,222,774 | B1 * | 4/2001 | Tanzawa et al. | 365/185.29 |
| 6,388,921 | B1 * | 5/2002 | Yamamoto et al. | 365/185.11 |

(Continued)

FOREIGN PATENT DOCUMENTS

| JP | 01-184793 | 7/1989 |
|---|---|---|
| JP | 04-061161 | 2/1992 |

(Continued)

OTHER PUBLICATIONS

International Search Report issued in International Patent Application No. PCT/JP2010/007285, mailed Mar. 1, 2011.

(Continued)

*Primary Examiner* — Richard Elms
*Assistant Examiner* — Mohammed A Bashar
(74) *Attorney, Agent, or Firm* — McDermott Will & Emery LLP

(57) ABSTRACT

In a semiconductor memory device in which each memory cell is constituted by one transistor, in a memory cell pattern, two adjacent bits form one diffusion pattern, two adjacent transistors share a source region, and two drain regions are separated from each other. A plurality of arrays in each of which at least a column of the diffusion patterns is disposed include bit lines, and the bit lines of the first array are independent of the bit lines of the second array. In an interface between the arrays, ends at one side of the bit lines of each of the arrays are located on an associated one of two drain regions which are separated from each other with the source region which is shared on one diffusion pattern sandwiched therebetween. This configuration can provide a sufficient bit-line separation width, and reduce the area.

17 Claims, 8 Drawing Sheets

(56) References Cited

U.S. PATENT DOCUMENTS

2003/0039146 A1    2/2003   Choi
2004/0213029 A1   10/2004   Hirata et al.
2007/0247887 A1*  10/2007   Park .............................. 365/63

FOREIGN PATENT DOCUMENTS

JP    08-250683    9/1996
JP    2002-158297   5/2002
JP    2004-327574  11/2004

OTHER PUBLICATIONS

English translation of Chinese Office Action and Search Report issued in corresponding Chinese Application No. 201080055292.9, dated Dec. 19, 2013.

* cited by examiner

SEMICONDUCTOR MEMORY DEVICE

CROSS-REFERENCE TO RELATED APPLICATION

This is a continuation of PCT International Application PCT/JP2010/007285 filed on Dec. 15, 2010, which claims priority to Japanese Patent Application No. 2010-017779 filed on Jan. 29, 2010. The disclosures of these applications including the specifications, the drawings, and the claims are hereby incorporated by reference in their entirety.

BACKGROUND

The present disclosure relates to layouts of semiconductor memory devices.

Among semiconductor memory devices, read only memories (ROMs) have an important function as nonvolatile memories, i.e., the function of not erasing data even after turning-off of power sources, and are widely used for various semiconductor products. A memory cell of a ROM can store 1-bit data by a single transistor, and thus, is more advantageous in terms of circuit scale, i.e., the area, than an SRAM which needs multiple transistors to store 1-bit data, for example.

In microfabrication processes, pattern formation has a large number of variation factors, and even target patterns having the same shape are greatly affected by other patterns disposed near the target patterns. In particular, memory cells are susceptible to characteristic variations. This is because the memory cells themselves are made of fine patterns, and in addition, a peripheral pattern greatly differs between a center portion and an end portion of a memory array in which a large number of the same type of memory cells are arranged in a wide range.

According to a conventional technique, in a ROM in which stored data is implemented by the difference among the threshold voltages of memory cell transistors, the amount of an impurity to be implanted immediately under the gate is controlled during fabrication in order to control the threshold voltage. In addition, at the interface between an actual use region and a blank region outside the actual use region, in order to reduce the influence of the blank region on a peripheral part of the actual use region, dummy processing for reducing variations depending on whether a resist opening is present or not is performed on a resist in the blank region. In this manner, characteristics of the actual use region is stabilized (see Japanese Patent Publication No. 2002-158297).

On the other hand, a contact control ROM in which data is stored depending on whether contact is present or not is also known. According to a conventional technique, in a contact control ROM, n-channel memory cell transistors in memory cells which are located adjacent to each other along the bit lines are separated from each other by a dummy transistor which is held OFF. In this manner, stress applied to the memory cell transistors is reduced (see Japanese Patent Publication No. 2004-327574).

SUMMARY

In a conventional semiconductor memory device with a hierarchical bit line structure in which a memory array is divided into a plurality of arrays, a sufficient width of bit-line separation cannot be obtained in some cases in connecting memory cells and bit lines. To obtain a sufficient width, a region for dividing bit lines can be additionally provided. In this case, however, the area disadvantageously increases.

Further, a dummy cell can be provided in an end portion of the memory array in order to uniformize characteristics of the end portion and the center portion of the memory array. In this case, the area also disadvantageously increases.

It is therefore an object of the present disclosure to reduce the area while keeping a sufficient bit-line separation width in a semiconductor memory device with a hierarchical bit line structure.

It is another object of the present disclosure to reduce the area while uniformizing characteristics of an end portion and a center portion of a memory array by devising arrangement of a memory cell and a dummy cell.

In an aspect of the present disclosure, in a semiconductor memory device in which each memory cell is constituted by one transistor, in a memory cell pattern, two adjacent bits form one diffusion pattern, two adjacent transistors share a source region, and two drain regions are separated from each other, the semiconductor memory device includes first and second arrays in each of which at least a column of the diffusion patterns is disposed, the first and second arrays include bit lines, the bit lines of the first array are independent of the bit lines of the second array, and in an interface between the arrays, ends at one side of the bit lines of each of the arrays are located on an associated one of two drain regions which are separated from each other with the source region which is shared on one diffusion pattern sandwiched therebetween.

In another aspect of the present disclosure, in a semiconductor memory device in which each memory cell is constituted by one transistor, in a memory cell pattern, two adjacent bits form one diffusion pattern, two adjacent transistors share a source region, and two drain regions are separated from each other, the semiconductor memory device includes a memory array in which at least a column of the diffusion patterns is disposed, and at least a transistor at an end in a column direction on the column of the diffusion patterns is always deactivated, and a transistor sharing a source region with the deactivated transistor is located at an end in a column direction on a plurality of activated transistors.

According to the present disclosure, in a hierarchical bit line structure in which a memory array is divided into a plurality of arrays, a large bit-line separation width can be obtained at the interface of divided arrays. Accordingly, no additional separation regions are necessary, and an increase in area can be reduced.

In addition, a dummy memory cell can be constituted by one transistor (i.e., a ½ cell pattern) in a cell pattern by devising arrangement of cell patterns in an actual use memory cell region. Accordingly, area reduction can be achieved. Furthermore, the reduction of the dummy cell region can shorten the bit line length. Accordingly, parasitic capacitance and parasitic resistance of the bit lines can be reduced, thereby allowing bit line operation to be performed in a short period. As a result, the access speed can be enhanced.

DETAILED DESCRIPTION

Embodiments of the present disclosure will be described in detail hereinafter with reference to the drawings.

First Embodiment

Figure 1:
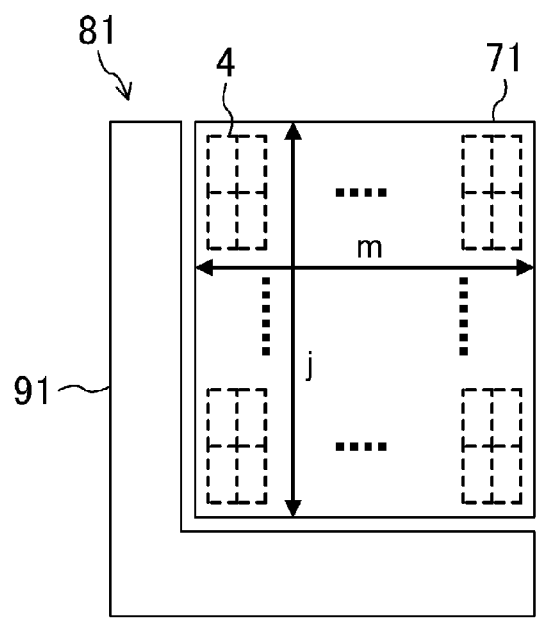
FIG. 1 is a block diagram illustrating a ROM according to a first embodiment of the present disclosure.

FIG. 1 is a block diagram illustrating a ROM 81 according to a first embodiment of the present disclosure. In FIG. 1, reference character 71 denotes a memory array in which cell patterns 4 are arranged in a matrix (m×j). Here, m is the number of cell patterns laterally arranged (i.e., along the word lines), and j is the number of cell patterns vertically arranged (i.e., along the bit lines). Reference character 91 denotes a peripheral circuit for outputting stored data of a ROM memory cell, and is connected to the memory array 71 through word lines and bit lines.

Figure 2A:
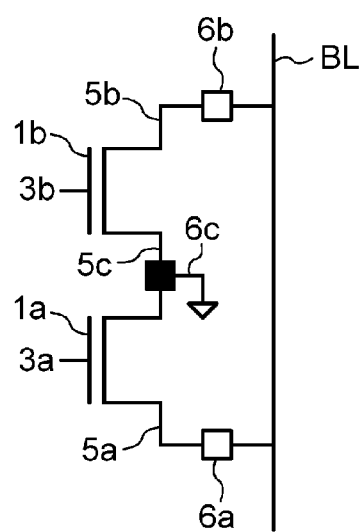
FIG. 2A is a circuit diagram illustrating one of the cell patterns shown in FIG. 1.
Figure 2B:
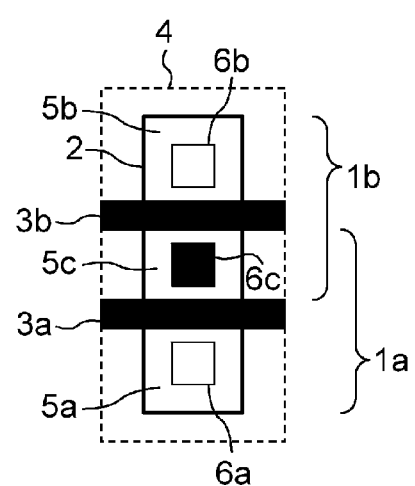
FIG. 2B is a view illustrating a layout pattern of the cell pattern shown in FIG. 2A.

FIG. 2A is a circuit diagram illustrating one of the cell patterns 4 shown in FIG. 1. FIG. 2B is a view illustrating a layout pattern of the cell pattern shown in FIG. 2A. In FIGS. 2A and 2B, reference characters 1a and 1b denote n-channel memory cell transistors each constituting one ROM memory cell. Reference character 2 denotes a diffusion pattern constituting the memory cell transistors 1a and 1b. Reference characters 3a and 3b denote gate terminals of the memory cell transistors 1a and 1b which are connected to word lines. Reference characters 5a, 5b, and 5c denote diffusion regions. The diffusion region 5c serves as a source region shared by the memory cell transistors 1a and 1b, and is connected to an upper metal interconnect through a contact 6c in general. The diffusion regions 5a and 5b are drain regions of the memory cell transistors 1a and 1b. Stored data of the ROM memory cell is output to a bit line BL in an upper layer, depending on whether or not the contacts 6a and 6b are present on the drain regions 5a and 5b. As described above, the two memory cell transistors 1a and 1b share the source region 5c, and constitute one single cell pattern 4.

Figure 3:
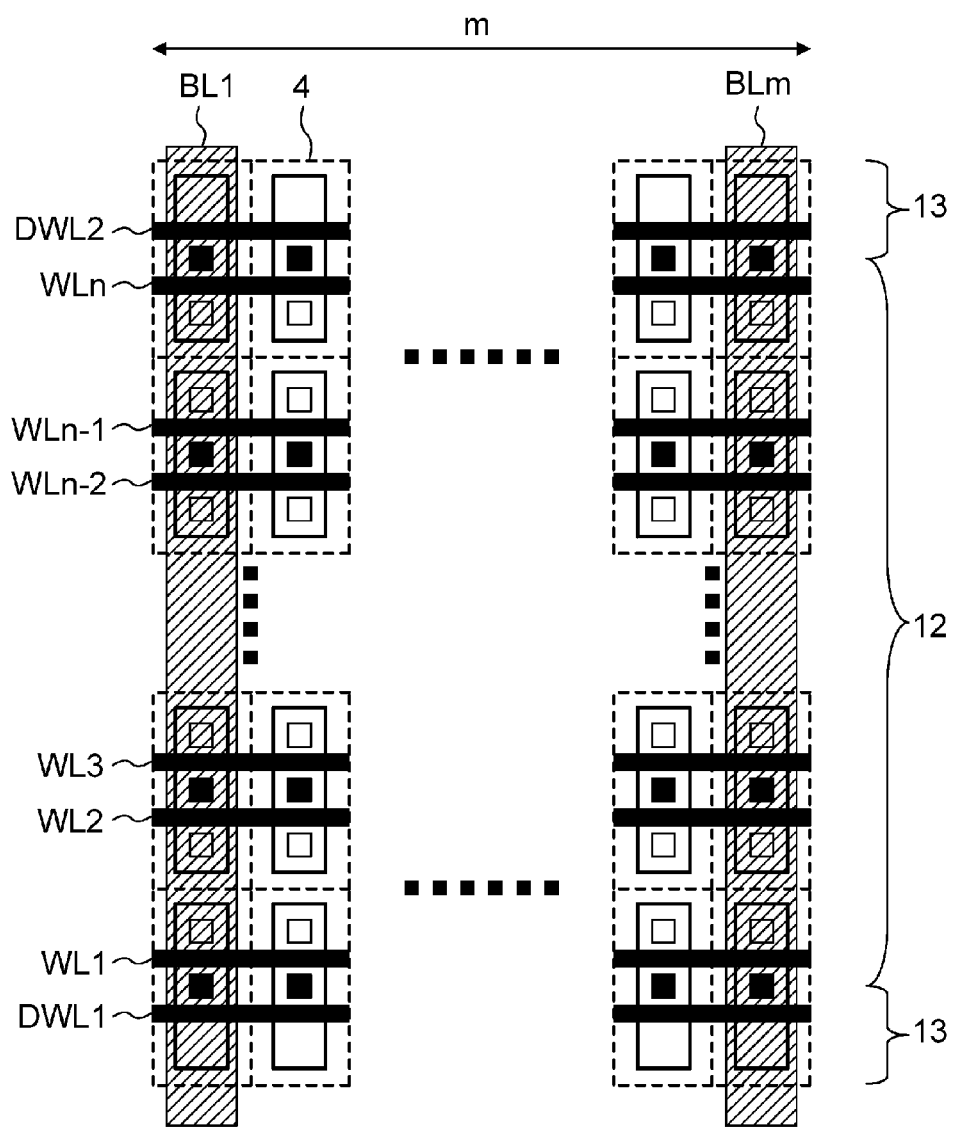
FIG. 3 is a view illustrating a detailed layout pattern of a memory array shown in FIG. 1.

FIG. 3 is a view illustrating a detailed layout pattern of the memory array 71 shown in FIG. 1. In FIG. 3, reference character 12 denotes an actual use memory cell region, reference character 13 denotes a dummy cell region, reference characters WL1 to WLn denote word lines, reference characters DWL1 and DWL2 denote dummy word lines, and reference characters BL1 to BLm denote bit lines.

As shown in FIG. 3, the gate terminals 3a and 3b of laterally adjacent memory cell transistors are connected to each other, and serve as word lines. The word lines WL1, and WL2, . . . , and WLn are allocated to a plurality of gates in the memory array 71. Reference characters BL1 and BLm denote bit lines vertically arranged on the memory cell transistors in FIG. 3. The bit lines BL1 and BLm are used to read stored data through the contacts 6a and 6b in the memory cells. The bit lines BL2 to BLm−1 located between the bit lines BL1 and BLm are not shown.

In the cell patterns 4 arranged in a matrix (m×j) in the memory array 71, the actual use memory cell region 12 is a region actually used for data storage, and includes a plurality of ROM memory cells. The dummy cell regions 13 are regions vertically sandwiching the actual use memory cell region 12. These dummy cell regions 13 does not directly contribute to operation of the ROM. Specifically, a dummy cell is always deactivated by setting the dummy word lines DWL1 and DWL2 in a floating state or fixing the potentials of the dummy word lines DWL1 and DWL2 so that the potential of the dummy cell is not controlled. Such a dummy cell is distinguished from an actual use memory cell which is activated.

Description is now focused on the interfaces between the actual use memory cell region 12 and the dummy cell regions 13. A center portion of the actual use memory cell region 12 is constituted by "units of the cell patterns 4," whereas an end portion thereof is constituted only by one of the memory cell transistors in each of the cell patterns 4 located at the end. In the end portion, the other memory cell transistor which is not used serves as a dummy cell. Consequently, the center portion of the actual use memory cell region 12 is constituted by 2-memory-cell units (i.e., units of the cell patterns 4), and the end portion is constituted by 1-memory-cell units (i.e., ½ of the cell patterns 4). In addition, one transistor is disposed as a dummy cell at each of the upper and lower ends of the actual use memory cell region 12.

In this case, the number of vertically arranged cell patterns 4 is j, and the number of word lines associated with these cell patterns 4 is n. The number j of the vertically arranged cell patterns 4 is obtained by the following equation:

$$j=(n-2)/2+(\tfrac{1}{2})\times 2+(\tfrac{1}{2})\times 2=n/2+1$$

where the first term (n−2)/2 of the middle side is the number of cell patterns 4 associated with the word lines WL2 to WLn−1, the second term (½)×2 of the middle side is the number of cell patterns 4 associated with the word lines WL1 and WLn, and the third term (½)×2 of the middle side is the number of cell patterns 4 associated with the upper and lower dummy cell regions 13.

According to the foregoing first embodiment, in each of the upper and lower dummy cell regions 13, the dummy cell does not have a 1-cell pattern (two transistors), but has a ½-cell pattern (one transistor). Thus, the dummy cell regions 13 can be reduced, and the number of cell patterns can also be reduced accordingly. As a result, the area reduction as a ROM can be achieved. In addition, since the number of cells arranged along bit lines can be reduced, the bit lines can be shortened. Accordingly, the parasitic capacitance and parasitic resistance of the bit lines can be reduced, resulting in enhancement of performance of the ROM.

Second Embodiment

Figure 4:
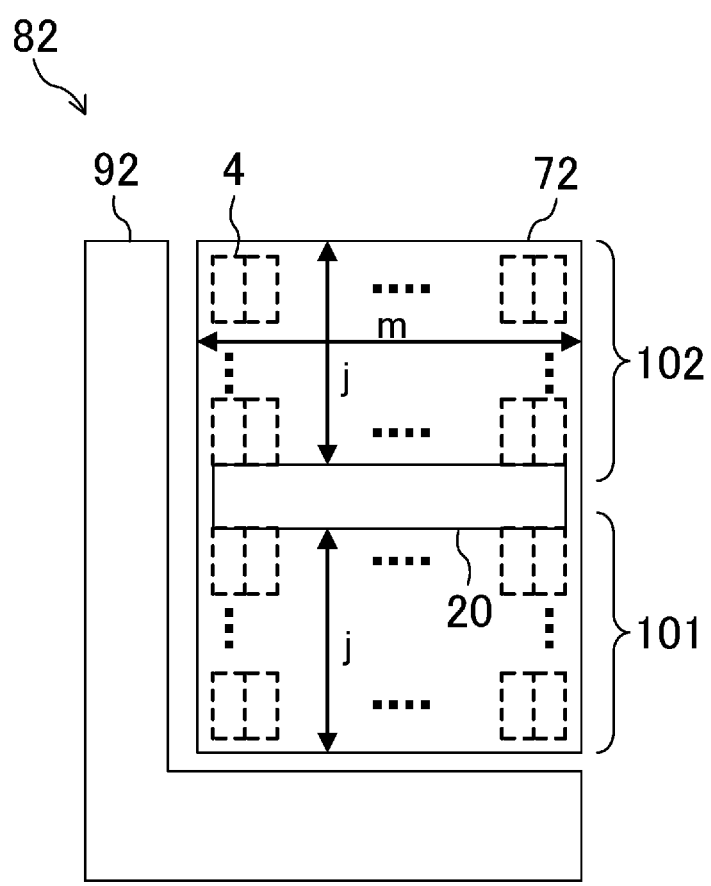
FIG. 4 is a block diagram illustrating a ROM with a hierarchical bit line structure including a memory array which is divided into two arrays according to a second embodiment of the present disclosure.

FIG. 4 is a block diagram illustrating a ROM 82 with a hierarchical bit line structure including a memory array 72 which is divided into two arrays according to a second embodiment of the present disclosure. In FIG. 4, reference character 72 denotes a memory array divided into two arrays: a first array 101 and a second array 102. The first and second arrays 101 and 102 are arrays in each of which cell patterns 4 are arranged in a matrix (m×j). Reference character 20 denotes a logic circuit. The logic circuit 20 has a different pattern from those of the first and second arrays 101 and 102, is connected to the first and second arrays 101 and 102 through bit lines, and includes, for example, amplifiers for controlling reading of the ROM. Reference character 92 denotes a peripheral circuit. The logic circuit 20 outputs stored data to outside the ROM through another lines.

Figure 5:
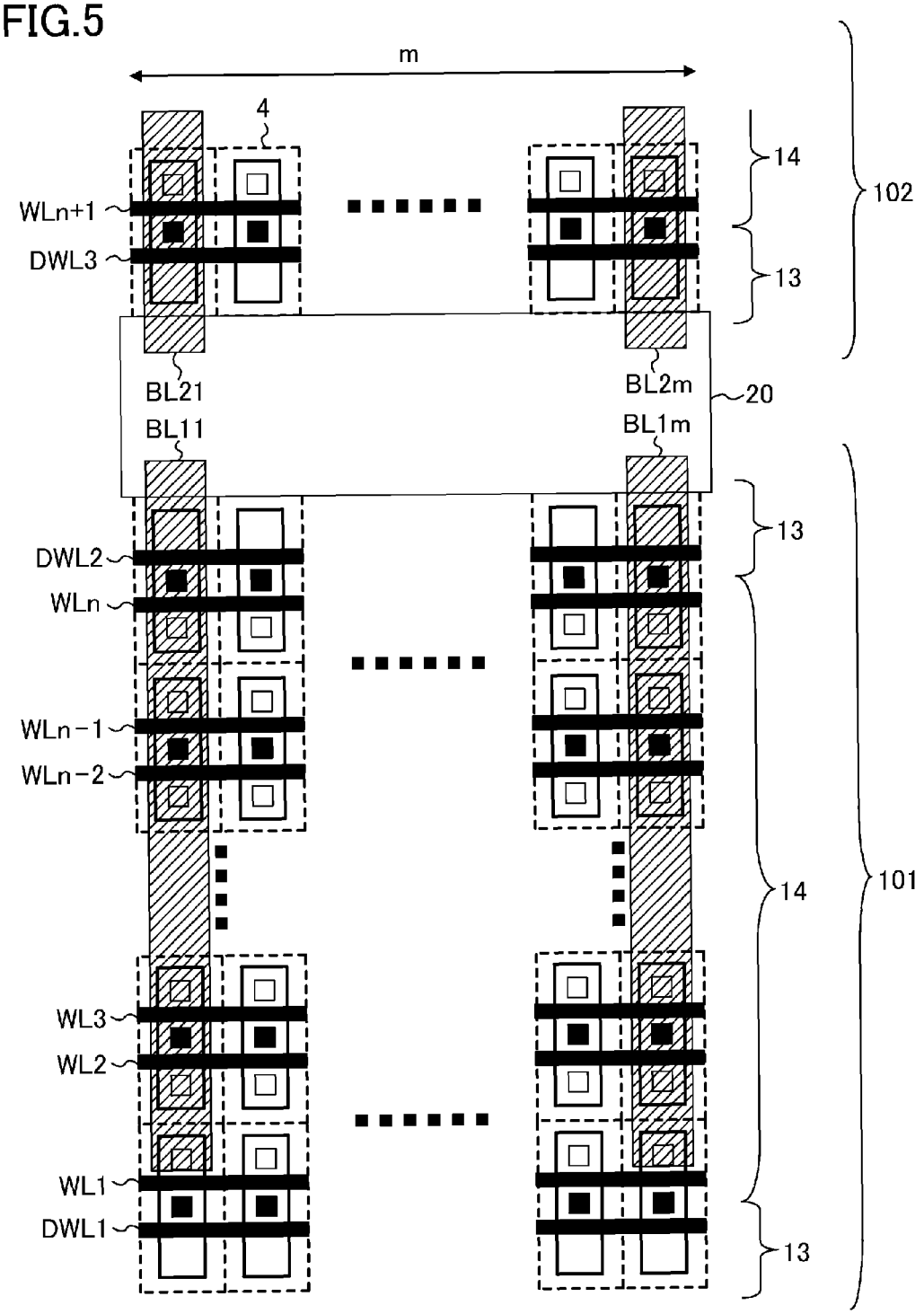
FIG. 5 is a view illustrating a detailed layout pattern of a memory array shown in FIG. 4.

FIG. 5 is a view illustrating a detailed layout pattern of the memory array 72 shown in FIG. 4. Each of the first array 101 and the second array 102 includes bit lines BL11 to BL1m and BL21 to BL2m corresponding to the columns. The bit lines are independent of each other, and are individually connected to the logic circuit 20, thereby outputting memory cell data to outside the ROM through the logic circuit 20.

The arrangement of the cell patterns 4 in the first and second arrays 101 and 102 conforms to that of the first embodiment, and the lowest cell pattern 4 in FIG. 5 as an end of the array is the lowest end of an actual use memory cell region 14 to which a word line WL1 is connected and a dummy cell region 13.

The upper end of the first array 101 is in contact with the logic circuit 20. Unlike a memory cell, the logic circuit 20 generally has a rougher pattern than that of the memory cell. Accordingly, the dummy cell region 13 is also needed at the upper end of the actual use memory cell region 14 in contact with the logic circuit 20, in order to stabilize memory cell characteristics.

Since a transistor in the cell pattern 4 is used as a dummy cell in the upper end of the actual use memory cell region 14, redundancy corresponding to one cell occurs in the cell pattern 4 located in the upper end of the actual use memory cell region 14. Accordingly, this redundant cell can be used as a dummy cell between the logic circuit 20 and the dummy cell region 13. As a result, the cell pattern 4 of the dummy cell region 13 can also be reduced to ½ at the interface with the logic circuit 20.

No bit lines are necessary on the dummy cell region 13 in the lower end of the first array 101, and the bit lines can be shortened accordingly.

The foregoing arrangement is applicable to both the first and second arrays 101 and 102. Even if the number of divided arrays increases, the foregoing arrangement is also applicable to all the arrays. Specific examples will be described below.

Third Embodiment

Figure 6:
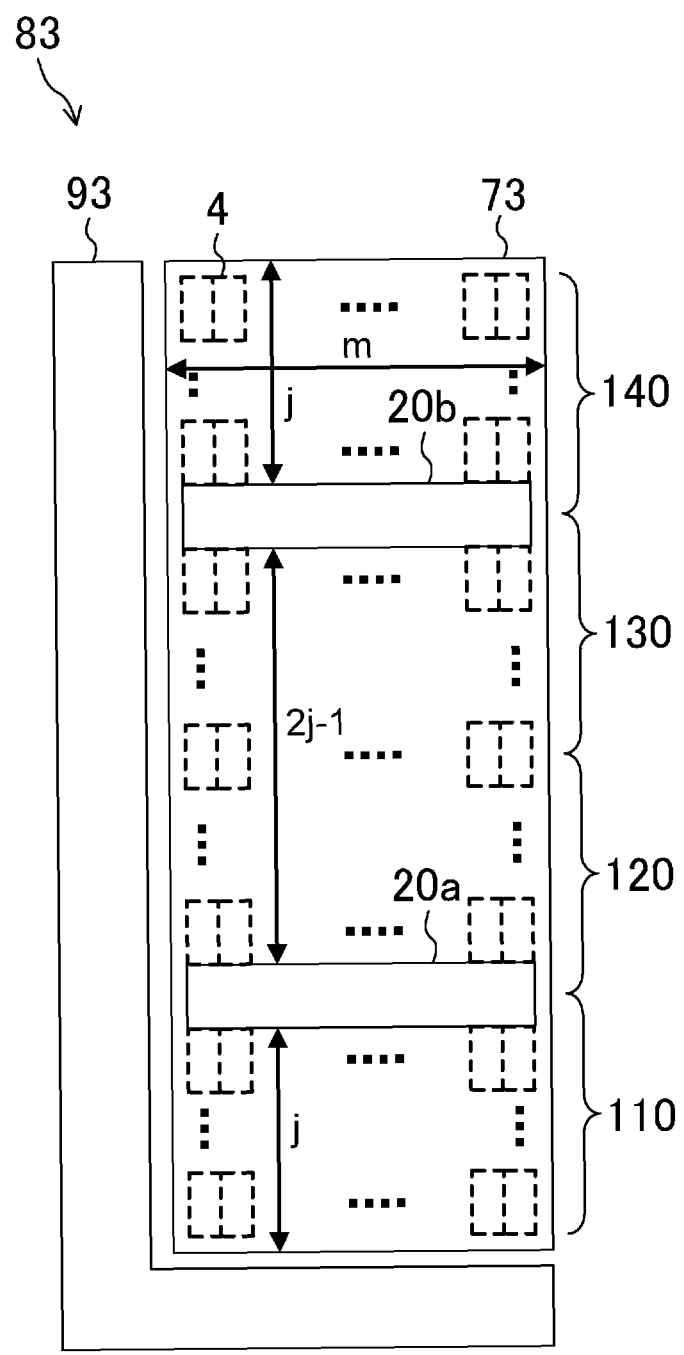
FIG. 6 is a block diagram illustrating a ROM with a hierarchical bit line structure in which a memory array is divided into four arrays according to a third embodiment of the present disclosure.

FIG. 6 is a block diagram illustrating a ROM 83 with a hierarchical bit line structure in which a memory array 73 is divided into four arrays according to a third embodiment of the present disclosure. In FIG. 6, reference character 73 denotes a memory array divided into four arrays: a first array 110; a second array 120; a third array 130; and a fourth array 140. Reference characters 20a and 20b denote first and second logic circuits corresponding to the logic circuit 20 of the second embodiment, including, for example, amplifiers, and having patterns completely different from those of the first through fourth arrays 110, 120, 130, and 140. The first logic circuit 20a is connected to the first and second arrays 110 and 120 through bit lines. The second logic circuit 20b is connected to the third and fourth arrays 130 and 140 through bit lines. The first and second logic circuits 20a and 20b are connected to other lines to output stored data. Reference character 93 denotes a peripheral circuit.

Figure 7:
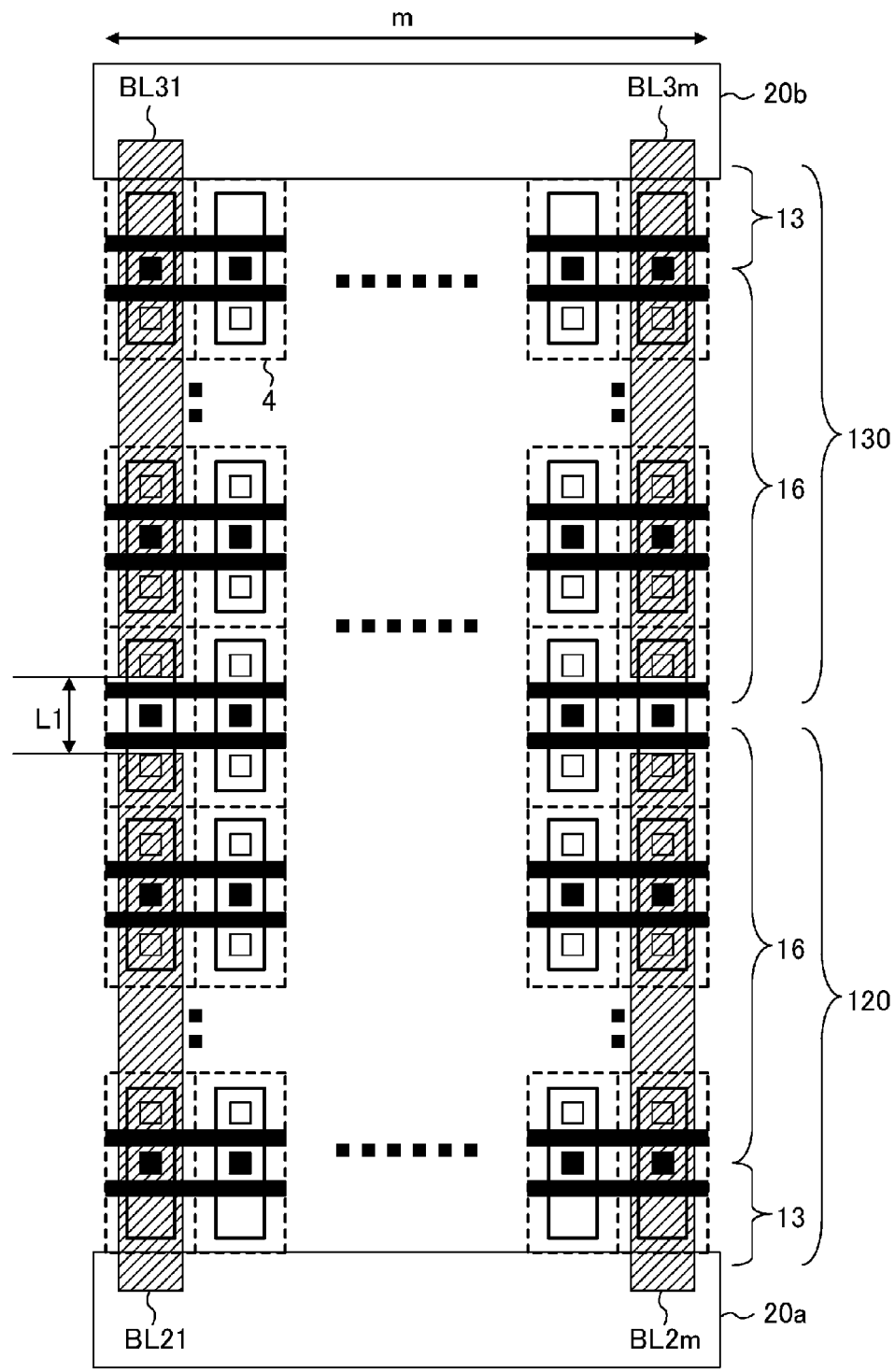
FIG. 7 is a view illustrating a detailed layout pattern of a memory array shown in FIG. 6.

FIG. 7 is a view illustrating a detailed layout pattern of the memory array 73 shown in FIG. 6. Specifically, FIG. 7 is an enlarged view illustrating the second and third arrays 120 and 130 located between the first logic circuit 20a and the second logic circuit 20b in the memory array 73. Reference character 16 denotes an actual use memory cell region, and reference character 13 denotes a dummy cell region.

Figure 8:
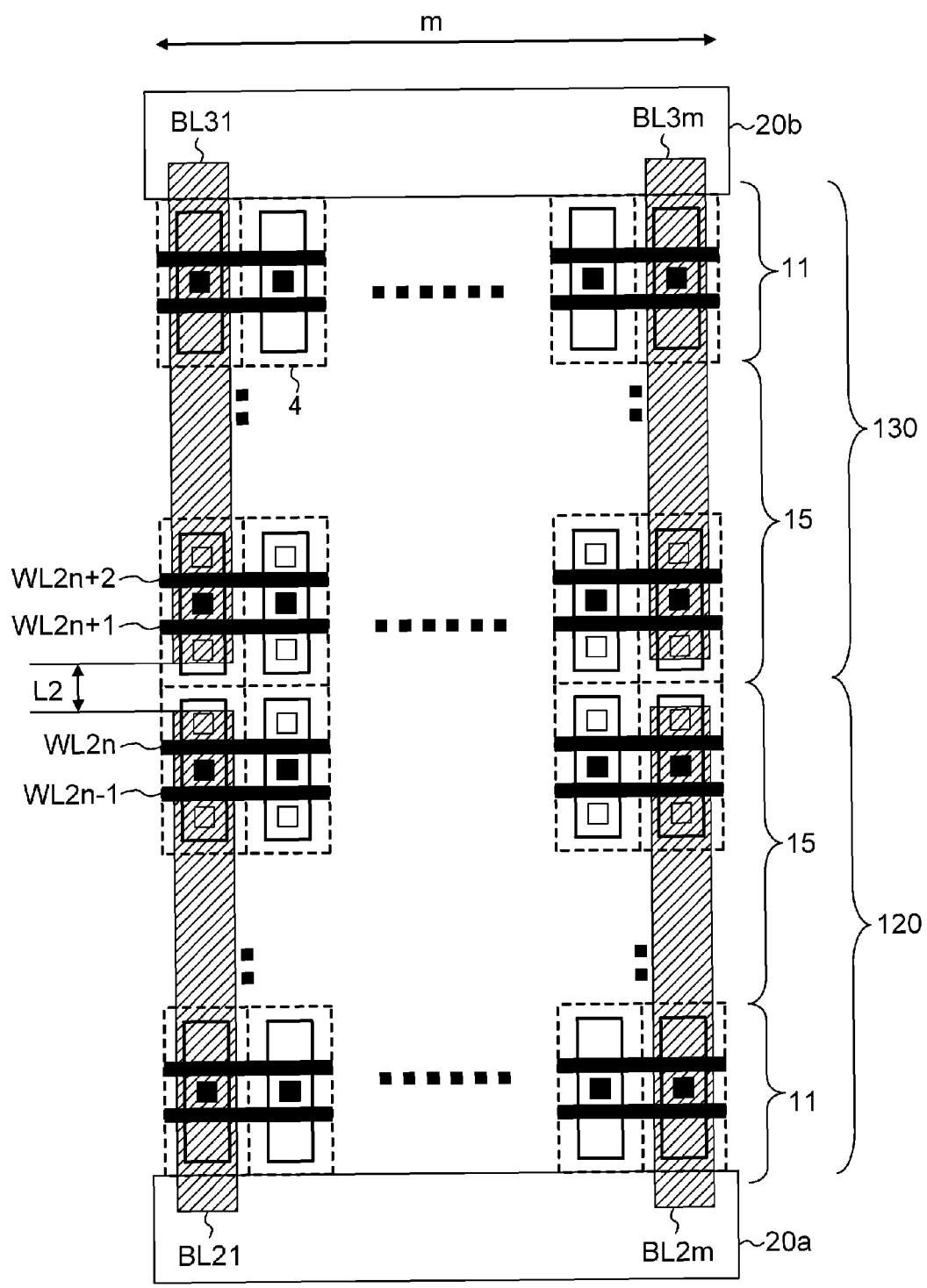
FIG. 8 is a view illustrating a detailed layout pattern of a memory array shown in FIG. 6 according to a comparative example.

FIG. 8 is a view illustrating a detailed layout pattern of the memory array 73 shown in FIG. 6 according to a comparative example. Reference character 15 denotes an actual use memory cell region, and reference character 11 denotes a dummy cell region. The difference between FIG. 7 and FIG. 8 is the arrangement of the cell patterns 4. The dummy cell at the interface with the first and second logic circuits 20a and 20b each at an end of the array has a ½-cell pattern (one transistor) in FIG. 7, and a 1-cell pattern (two transistors) in FIG. 8.

Description is now focused on the interface between the second array 120 and the third array 130. The second array 120 and the third array 130 is separated from each other in terms of operation. Bit lines BL21 to BL2m of the second array 120 are respectively independent of bit lines BL31 to BL3m of the third array 130. The bit lines BL21 to BL2m of the second array 120 are connected to the first logic circuit 20a, and the bit lines BL31 to BL3m of the third array 130 are connected to the second logic circuit 20b. In FIGS. 7 and 8, since the bit lines need to be separated from each other at the array interface, the array interface is logically located at the ends of the arrays. However, since the cell patterns 4 are arranged in series, the array interface is not the end in terms of light exposure as a fabrication condition. Accordingly, it is inherently unnecessary to dispose a cell pattern as a dummy in the interface between the second array 120 and the third array 130.

However, separation of bit lines at the array interface has a problem. Specifically, in FIG. 8, bit-line separation has a diffusion region distance L2 between cell patterns. On the other hand, in FIG. 7, bit-line separation has a distance L1 between the diffusion regions 5a and 5b in the same cell pattern. The distance L2 is a distance between diffusion regions of adjacent cell patterns, whereas the distance L1 has a configuration in which a source region and two gates are sandwiched between the diffusion regions 5a and 5b. Thus, the distance L1 is large, and the relationship L2<L1 is established.

In microfabrication, not only patterns of diffusion layers but also patterns of interconnect layers are considerably restricted, and the bit-line separation width is also restricted. In the case of L2<L3 where L3 is the width necessary for bit-line separation, the distance for separating bit lines is insufficient in FIG. 8. Accordingly, it is necessary to enlarge the diffusion region as a region for separating bit lines, resulting in the necessity of a large interface between cell patterns. In addition, in the memory array 73 in which the same cell patterns are arranged, if the distance between part of the cell patterns is made different from the distance between another part of the cell patterns, uniformity of the patterns is impaired. Thus, to obtain uniformity of the cells while maintaining a sufficient bit-line separation width, an additional dummy cell pattern needs to be inserted. These configurations cause an increase in the area.

In the connection shown in FIG. 7, the bit-line separation width is larger than that in FIG. 8. Thus, a larger margin can be obtained for the width L3 necessary for separation of bit lines (in the case of L3<L1), and a factor for increase in area, such as insertion of a dummy cell, can be eliminated.

Figure 9:
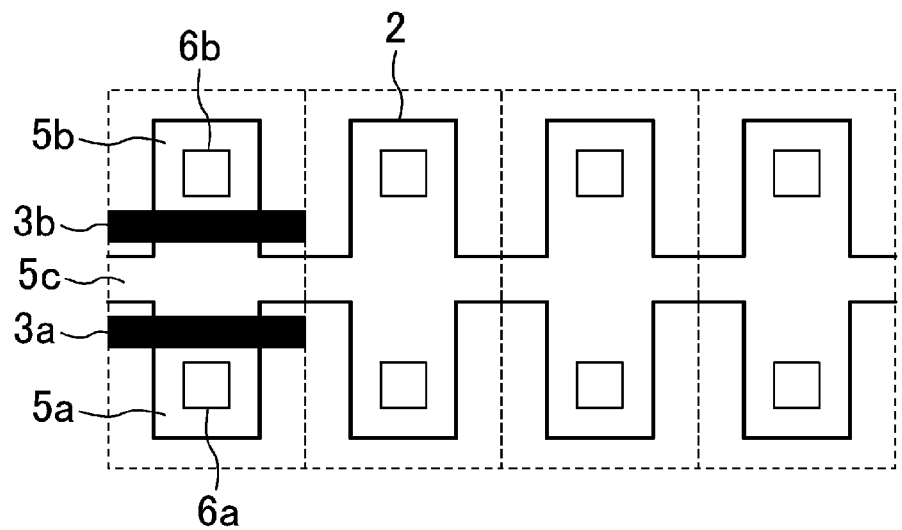
FIG. 9 is a view illustrating a layout pattern of a ROM memory cell according to a variation of FIG. 2B.

The memory cell configuration of the present disclosure is not limited to the shape of the cell pattern 4 in FIG. 2B, and is also effective for a configuration in which the source region 5c is connected to an adjacent cell is used as a ground line as shown in FIG. 9.

The foregoing description is related to a contact control ROM in which data is stored depending on whether contact is present or not. However, the present disclosure is not limited to this type of ROM, and is also applicable to a semiconductor memory device in which cell patterns are repeatedly arranged. For example, the present disclosure is applicable to flash memories.

Figure 10:
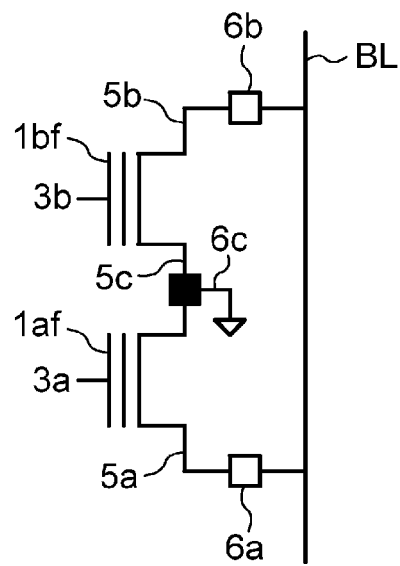
FIG. 10 is a circuit diagram illustrating a cell pattern in a flash memory according to a variation of FIG. 2A.

FIG. 10 is a circuit diagram illustrating the case of a flash memory having a configuration in which the ROM memory cell transistors 1a and 1b in FIG. 2A are replaced by flash memory cell transistors 1af and 1bf. The flash memory includes floating gates in transistors, and thus, is capable of storing 1-bit data with one transistor. The circuit connection of the flash memory can have the same pattern as that of a ROM. Specifically, the circuit connection around the transistors in FIG. 10 is the same as that in FIG. 2A, and the MOS memory cell transistors 1a and 1b generally employed in a ROM are replaced by the flash memory cell transistors 1af and 1bf having floating gates. In the flash memory, the layout pattern when viewed from the upper layer of the chip is the same as that in FIG. 2B.

In each of the first through third embodiments, the memory cell transistors may be replaced by flash memory cell transistors.

As described above, the semiconductor memory device of the present disclosure is useful for a hierarchical bit line structure in which a memory array is divided into a plurality of arrays because the area can be reduced with a sufficient bit-line separation width maintained in the interface between divided arrays.

In addition, in the semiconductor memory device of the present disclosure, peripheral dummy cell patterns around the memory array are reduced, thereby reducing the area while maintaining memory cell characteristics. The present disclosure is effective especially for a memory with a hierarchical bit line structure having a large number of cell patterns in the peripheries of arrays.

What is claimed is:

1. A semiconductor memory device comprising:
a column of a plurality of cell patterns;
a first bit line; and
a second bit line, wherein:
each of the plurality of cell patterns includes only one pair of transistors as a memory cell transistor, the one pair of transistors sharing a source region, two drain regions of the one pair of transistors being separated from each other,
the plurality of cell patterns includes a first cell pattern comprising a first pair of transistors of a first transistor and a second transistor, the first bit line overlapping a first drain region of the first transistor and the second bit line overlapping a second drain region of the second transistor,
the first bit line and the second bit line are separated from each other, and
a first edge of the first bit line overlaps the first cell pattern and a second edge of the second bit line overlaps the first cell pattern, in a plan view.

2. The semiconductor memory device of claim 1, further comprising:
an end cell pattern located on an end portion of the column of the plurality of cell patterns, wherein:
the end cell pattern includes only one pair of transistors of a third transistor and a fourth transistor,
the third transistor is an active memory cell transistor, and the fourth transistor is an inactive memory cell transistor.

3. The semiconductor memory device of claim 2, wherein a potential of a gate terminal of the fourth transistor is fixed or floating.

4. The semiconductor memory device of claim 2, wherein the fourth transistor is always off.

5. The semiconductor memory device of claim 1, further comprising a first amplifier connected to the first bit line.

6. The semiconductor memory device of claim 5, further comprising a second amplifier connected to the second bit line.

7. The semiconductor memory device of claim 1, wherein the plurality of cell patterns are ROM memory cells.

8. The semiconductor memory device of claim 1, wherein the plurality of cell patterns are flash memory cells.

9. The semiconductor memory device of claim 2, wherein the third transistor is disposed closer to the first cell pattern than the fourth transistor is.

10. A semiconductor memory device comprising:
cell patterns arranged in m-columns×j-rows matrix, m and j being a positive integer;
bit lines, a number of the bit lines being m; and
word lines, a number of the word lines being n, where n is a positive integer satisfying j=n/2+1, wherein:
each of the m-columns includes first to j-th cell patterns arranged in this order,
each of second to (j−1)-th cell patterns includes only one pair of transistors as a memory cell transistor, the one pair of transistors sharing a source region, two drain regions of the one pair of transistors being separated from each other,
each of the first and j-th cell patterns includes only one pair of transistors of a third transistor and a fourth transistor, the third transistor being an active memory cell transistor, and the fourth transistor being an inactive memory cell transistor,
each of the bit lines includes a first bit line and a second bit line separated from the first bit line, and
a first edge of the first bit line overlaps the (j+1)/2-th cell pattern and a second edge of the second bit line overlaps the (j+1)/2-th cell pattern, in a plan view.

11. The semiconductor memory device of claim 10, wherein:
one or more of one of drain regions of the pair of transistors in a (j+1)/2-th cell pattern and drain regions of the pair of transistors in the first to (j−1)/2-th cell patterns are connected to the first bit line, and
one or more of another of drain regions of the pair of transistors in the (j+1)/2-th cell pattern and drain regions of the pair of transistors in a (j+3)/2-th cell patterns are connected to the second bit line.

12. The semiconductor memory device of claim 10, further comprising:
a first dummy word line provided for the fourth transistor of the first cell pattern, and
a second dummy word line provided for the fourth transistor of the j-th cell pattern.

13. The semiconductor memory device of claim 10, wherein a potential of a gate terminal of the fourth transistor is fixed or floating.

14. The semiconductor memory device of claim 10, wherein the fourth transistor is always off.

15. The semiconductor memory device of claim 10, wherein the plurality of cell patterns are ROM memory cells.

16. The semiconductor memory device of claim 10, wherein the plurality of cell patterns are flash memory cells.

17. The semiconductor memory device of claim 10, wherein the third transistor is disposed closer to a (j+1)/2-th cell pattern than the fourth transistor is.

* * * * *